(12) United States Patent
Hsin et al.

(10) Patent No.: US 7,583,361 B2
(45) Date of Patent: Sep. 1, 2009

(54) SYSTEM FOR CONTROLLING A DUAL MOVER ASSEMBLY FOR AN EXPOSURE APPARATUS

(75) Inventors: Yi-Ping Hsin, Dublin, CA (US); Hideyuki Hashimoto, Kumagaya (JP); Jin Nishikawa, Kumagaya (JP); Bausan Yuan, San Jose, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 235 days.

(21) Appl. No.: 11/369,493

(22) Filed: Mar. 7, 2006

(65) Prior Publication Data

US 2007/0211237 A1 Sep. 13, 2007

(51) Int. Cl.
*G03B 27/58* (2006.01)
(52) U.S. Cl. .................. 355/72; 355/53; 355/30
(58) Field of Classification Search ............ 355/72, 355/73, 74, 75; 318/10, 12, 62, 640
See application file for complete search history.

(56) References Cited

U.S. PATENT DOCUMENTS

2004/0128918 A1* 7/2004 Yang et al. ............... 52/7

OTHER PUBLICATIONS

The cited U.S. patents and U.S. published patent applications are not enclosed pursuant to the Official Gazette Notice of Aug. 5, 2003 stating that Information Disclosure Statements may be filed without copies of U.S. patents and published applications in patent applications filed after Jun. 30, 2003.

G. F. Franklin, J.D. Powell, and M. Workman, "Digital Control of Dynamic Systems, third edition", pp. 430-431, 1997.

* cited by examiner

*Primary Examiner*—Diane I Lee
*Assistant Examiner*—Mesfin T Asfaw
(74) *Attorney, Agent, or Firm*—Roeder & Broder LLP

(57) ABSTRACT

A precision assembly (210) for positioning a device (226) includes a stage (260) that retains the device (226), a dual mover assembly (228) that moves the stage (260), and the device (226) along a movement axis (266), a measurement system (222) and a control system (224). The dual mover assembly (228) includes a first mover (262) that moves the stage (260) along the movement axis (266) and a second mover (264) that moves the device (226) along the movement axis (266). The second mover (264) is rigidly coupled to the first mover (262) so that movement of the first mover (262) results in movement of the second mover (264). Further, the total output of the dual mover assembly (228) along the movement axis (266) is equal to the sum of the movement of the first mover (262) and the movement of the second mover (264). The measurement system (222) measures a movement position along the movement axis (266). The control system (224) controls the dual mover assembly (228) utilizing the movement position. The control system (224) is designed to effectively decouple the control of the first mover (262) from the control of the second mover (264). Further, the control system (224) includes a quantization feedforward loop.

29 Claims, 14 Drawing Sheets

SYSTEM FOR CONTROLLING A DUAL MOVER ASSEMBLY FOR AN EXPOSURE APPARATUS

BACKGROUND

Exposure apparatuses for semiconductor processing are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, a measurement system, and a control system.

In certain designs, one or more mover assemblies are used to move and position one or more optical elements in the optical assembly. The size of the images and features within the images transferred onto the wafer from the reticle are extremely small. As a result thereof, the precise positioning of the one or more optical elements is critical to the manufacture of high density, semiconductor wafers.

SUMMARY

The present invention is directed a precision assembly for moving and positioning a device. The precision assembly includes a stage that retains the device, a dual mover assembly that moves the stage and the device along a movement axis, a measurement system and a control system. As provided herein, the dual mover assembly includes a first mover that moves the stage along the movement axis and a second mover that moves the device along the movement axis.

Additionally, the second mover is rigidly coupled to the first mover so that movement of the first mover results in movement of the second mover. Further, the total output of the dual mover assembly along the movement axis is equal to the sum of the movement of the first mover and the movement of the second mover. The measurement system measures an overall measured position along the movement axis. The control system controls the dual mover assembly utilizing the measured position.

In one embodiment, the control system effectively decouples the control of the first mover from the control of the second mover. For example, the control system can utilize a first mover path, a second mover path and a decoupled path. With this design, a servo loop for the first mover is designed as a single actuator design and a servo loop for the second mover is designed as a single actuator design. Further, a sensitivity function of the dual mover assembly is approximately equal to a sensitivity of the first mover multiplied by a sensitivity of the second mover.

In another embodiment, the control system includes a quantization error feedforward loop. For example, the quantization error feedforward loop can include transferring a quantization error from the coarse first mover to the fine second mover. With this design, the quantization error of the dual mover assembly is equal to a quantization error of the fine second mover.

Additionally, the present invention can be directed to an optical assembly and an exposure apparatus for transferring an image from a reticle to a substrate. Further, the present invention is also directed to a wafer, a method for moving a device, a method for manufacturing an exposure apparatus, and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
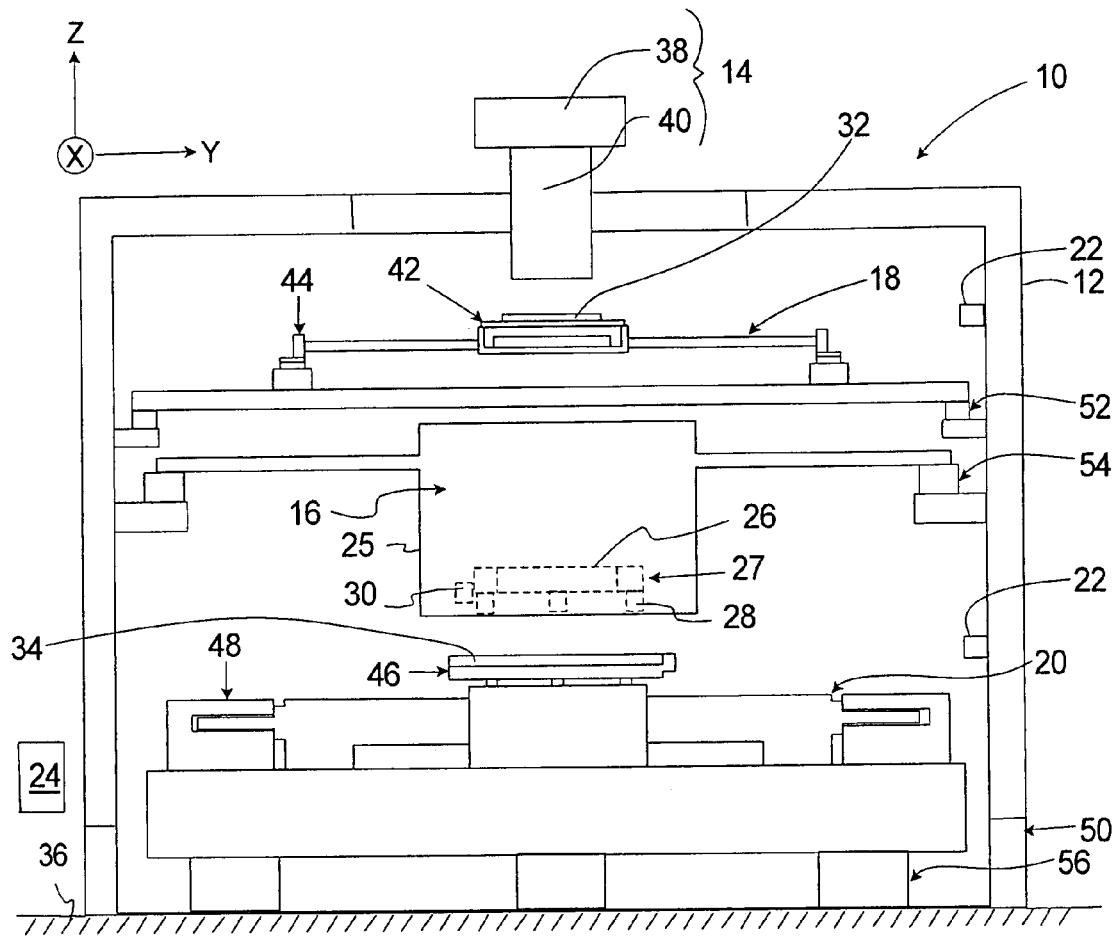
FIG. 1 is a simplified schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

As an overview, in FIG. 1, the optical assembly 16 includes an optical housing 25, one or more optical elements 26 (only one is illustrated in phantom), and one or more optical stage assemblies 27 (only one is illustrated in phantom) that retain and position the optical elements 26. In one embodiment, the optical stage assembly 27 includes one or more dual mover assemblies 28 that precisely position the optical element 26. Further, the measurement system 22 includes one or more sensors 30 (illustrated in phantom) for monitoring the position of the optical element 26 or a portion of the optical stage assembly 27. As provided herein, the control system 24 is uniquely designed to precisely control the one or more dual mover assemblies 28 to precisely adjust the position of the optical element 26. As a result thereof, the exposure apparatus 10 is capable of manufacturing higher precision devices, such as higher density, semiconductor wafers.

A number of Figures include an orientation system that illustrates an X axis, a Y axis that is orthogonal to the X axis and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 32 onto a semiconductor wafer 34. The exposure apparatus 10 mounts to a mounting base 36, e.g., the ground, a base, or floor or some other supporting structure.

There are a number of different types of lithographic devices. For example, the exposure apparatus 10 can be used as a scanning type photolithography system that exposes the pattern from the reticle 32 onto the wafer 34 with the reticle 32 and the wafer 34 moving synchronously. In a scanning type lithographic device, the reticle 32 is moved perpendicularly to an optical axis of the optical assembly 16 by the reticle stage assembly 18 and the wafer 34 is moved perpendicularly to the optical axis of the optical assembly 16 by the wafer stage assembly 20. Scanning of the reticle 32 and the wafer 34 occurs while the reticle 32 and the wafer 34 are moving synchronously.

Alternatively, the exposure apparatus 10 can be a step-and-repeat type photolithography system that exposes the reticle 32 while the reticle 32 and the wafer 34 are stationary. In the step and repeat process, the wafer 34 is in a constant position relative to the reticle 32 and the optical assembly 16 during the exposure of an individual field. Subsequently, between consecutive exposure steps, the wafer 34 is consecutively moved with the wafer stage assembly 20 perpendicularly to the optical axis of the optical assembly 16 so that the next field of the wafer 34 is brought into position relative to the optical assembly 16 and the reticle 32 for exposure. Following this process, the images on the reticle 32 are sequentially exposed onto the fields of the wafer 34, and then the next field of the wafer 34 is brought into position relative to the optical assembly 16 and the reticle 32.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports the components of the exposure apparatus 10. The apparatus frame 12 illustrated in FIG. 1 supports the stage assemblies 18, 20, the optical assembly 16 and the illumination system 14 above the mounting base 36.

In one embodiment, the illumination system 14 includes an illumination source 38 and an illumination optical assembly 40. The illumination source 38 emits a beam (irradiation) of light energy. The illumination optical assembly 40 guides the beam of light energy from the illumination source 38 to the optical assembly 16. The beam illuminates selectively different portions of the reticle 32 and exposes the wafer 34. In FIG. 1, the illumination source 38 is illustrated as directing the energy beam through the reticle 32. Alternatively, the energy beam can be directed at the bottom of the reticle 32 and the energy beam can be reflected off of the reticle towards the optical assembly 16.

The illumination source 38 can be a g-line source (436 nm), an i-line source (365 nm), a KrF excimer laser (248 nm), an ArF excimer laser (193 nm) or a $F_2$ laser (157 nm). Alternatively, the illumination source 38 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 32 to the wafer 34. Depending upon the design of the exposure apparatus 10, the optical assembly 16 can magnify or reduce the image illuminated on the reticle 32. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

In FIG. 1, as described above, the optical assembly 16 includes an optical stage assembly 27 that retains and positions the optical element 26, and the optical stage assembly 27 includes one or more dual mover assemblies 28 that precisely position the optical element 26. With this design, the optical element 26 can be moved to increase the accuracy of the exposure apparatus 10. For example, for extreme ultraviolet lithography systems, the optical assembly 16 typically includes one or more reflective, optical elements 26, e.g. mirrors that are very position sensitive. Unfortunately, a portion of the extreme ultraviolet radiation can be absorbed by the optical elements 26. The absorbed ultraviolet radiation heats the illuminated regions of the optical elements 26 and causes the temperature in the illuminated regions to rise to a greater extent than the temperature in non-illuminated regions of the optical elements 26. The increase in temperature in the illuminated regions causes the optical element 26 to distort. This can blur the image that is transferred onto the wafer 34. In this example, the optical stage assembly 27 can be used to adjust the position of the optical element 26 to approximately compensate for the thermal distortion produced by the illumination beam. Alternatively, the optical stage assembly 27 can be used to adjust the position of the optical element 26 to correct other deficiencies with the image that is being transferred onto the wafer 34.

The reticle stage assembly 18 holds and positions the reticle 32 relative to the optical assembly 16 and the wafer 34. Somewhat similarly, the wafer stage assembly 20 holds and positions the wafer 34 with respect to the projected image of the illuminated portions of the reticle 32. The design of each stage assembly 18, 20 can be varied to suit the movement requirements of the exposure apparatus 10. In FIG. 1, the reticle stage assembly 18 includes a reticle stage 42 that retains the reticle 32 and a reticle mover assembly 44 that moves and positions the reticle stage 42 and the reticle 32 relative to the rest of the exposure apparatus 10. Somewhat similarly, the wafer stage assembly 20 includes a wafer stage 46 that retains the wafer 34 and a wafer mover assembly 48 that moves and positions the wafer stage 46 and the wafer 34 relative to the rest of the exposure apparatus 10.

When linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. As far as is permitted, the disclosures in U.S. Pat. Nos. 5,623,853 and 5,528,118 are incorporated herein by reference.

Alternatively, one or both of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

The measurement system 22 monitors movement of (i) the reticle stage 42 and the reticle 32 relative to the optical assembly 16 or some other reference, and (ii) the wafer stage 46 and the wafer 34 relative to the optical assembly 16 or some other reference. With this information, the control system 24 can control the reticle stage assembly 18 to precisely position the reticle 32 and the wafer stage assembly 20 to precisely position the wafer 34. For example, the measurement system 22 can utilize multiple laser interferometers, encoders, and/or other measuring devices.

As discussed above, the measurement system 22 includes one or more sensors 30 for monitoring the position of a portion of the optical stage assembly 27 and/or the optical element 26. For example, each sensor 30 can include a laser interferometer, an encoder, and/or another type of measuring device.

The control system 24 is electrically connected to the optical stage assembly 27, the reticle stage assembly 18, the wafer stage assembly 20, and the measurement system 22. The control system 24 receives information from the measurement system 22 and controls the stage assemblies 18, 20 to precisely position the reticle 32 and the wafer 34. Further, the control system 24 controls the operation of the optical stage assembly 27 to precisely position the optical element 26. The control system 24 can include one or more processors and circuits.

In one embodiment, the control system 24 is uniquely designed to precisely control the one or more dual mover assemblies 28. With this design, the dual mover assemblies 28 can precisely adjust the position of the optical element 26.

Additionally, the exposure apparatus 10 can include one or more isolation systems having features of the present invention. For example, in FIG. 1, the exposure apparatus 10 includes (i) a frame isolation system 50 that secures the apparatus frame 12 to the mounting base 36 and reduces the effect of vibration of the mounting base 36 causing vibration to the apparatus frame 12, (ii) a reticle stage isolation system 52 that secures and supports the reticle stage assembly 18 to the apparatus frame 12 and reduces the effect of vibration of the apparatus frame 12 causing vibration to the reticle stage assembly 18, (iii) an optical isolation system 54 that secures and supports the optical assembly 16 to the apparatus frame 12 and reduces the effect of vibration of the apparatus frame 12 causing vibration to the optical assembly 16, and (iv) a wafer stage isolation system 56 that secures and supports the wafer stage assembly 20 to the mounting base 36 and reduces the effect of vibration of the mounting base 36 causing vibration to the wafer stage assembly 20. In this embodiment, one or more of the isolation systems 50-56 can include one or more dual mover assemblies 28.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. There is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

This invention can be utilized in an immersion type exposure apparatus with taking suitable measures for a liquid. For example, PCT Patent Application WO 99/49504 discloses an exposure apparatus in which a liquid is supplied to the space between a substrate (wafer) and a projection lens system in exposure process. As far as is permitted, the disclosures in WO 99/49504 are incorporated herein by reference.

Further, this invention can be utilized in an exposure apparatus that comprises two or more substrate and/or reticle stages. In such apparatus, the additional stage may be used in parallel or preparatory steps while the other stage is being used for exposing. Such a multiple stage exposure apparatus are described, for example, in Japan Patent Application Disclosure No. 10-163099 as well as Japan Patent Application Disclosure No. 10-214783 and its counterparts U.S. Pat. Nos. 6,341,007, 6,400,441, 6,549,269, and 6,590,634. Also it is described in Japan Patent Application Disclosure No. 2000-505958 and its counterparts U.S. Pat. No. 5,969,411 as well as U.S. Pat. No. 6,208,407. As far as is permitted, the disclosures in the above-mentioned U.S. Patents, as well as the Japan Patent Applications, are incorporated herein by reference.

This invention can be utilized in an exposure apparatus that has a movable stage retaining a substrate (wafer) for exposing it, and a stage having various sensors or measurement tools for measuring, as described in Japan Patent Application Disclosure 11-135400. As far as is permitted, the disclosures in the above-mentioned Japan patent application are incorporated herein by reference.

Figure 2:
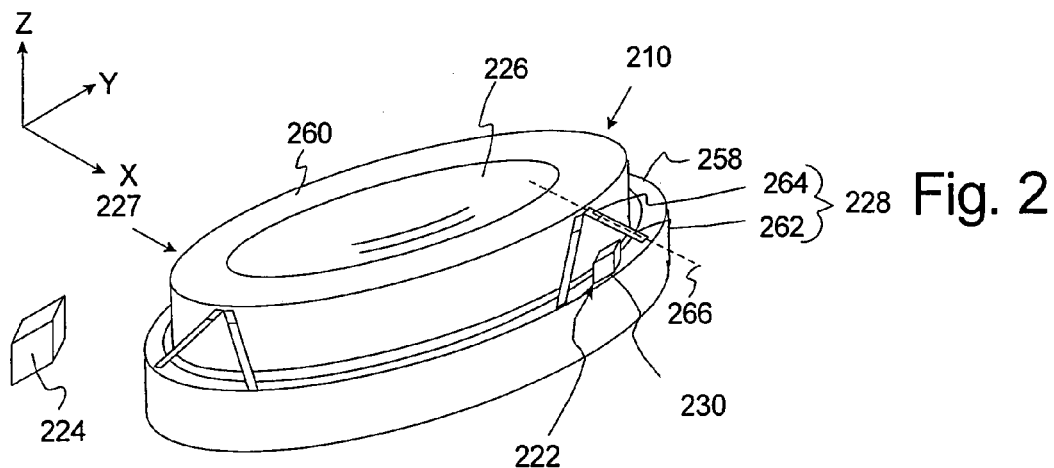
FIG. 2 is a simplified perspective illustration of a portion of a precision apparatus having features of the present invention.

FIG. 2 is a perspective illustration of a precision apparatus 210 that includes (i) a portion of a stage assembly 227 having a plurality of dual mover assemblies 228, (ii) an optical element 226, (iii) a portion of a measurement system 222, and (iv) a control system 224. In this embodiment, the dual mover assemblies 228 are used to precisely position the optical element 226. Alternatively, for example, the dual mover assemblies 228 can be used as part of (i) one or both of the mover assemblies 44, 48 (illustrated in FIG. 1), or (ii) one or all of the isolation systems 50-56 (illustrated in FIG. 1). Still alternatively, the dual mover assemblies 228 can be used to move and position other types of devices during manufacturing and/or inspection.

In FIG. 2, stage assembly 227 includes a stage base 258, and a stage 260 in addition to the one or more dual mover assemblies 228. The stage base 258 is rigid and can be secured to the optical housing 25 (illustrated in FIG. 1) of the optical assembly 16 (illustrated in FIG. 1). The stage 260 is rigid and retains the optical element 226.

The dual mover assemblies 228 move and position the stage 260 and the optical element 226 relative to the rest of the optical assembly 16 and the rest of the exposure apparatus 10 (illustrated in FIG. 1). In FIG. 2, the stage assembly 227 includes six dual mover assemblies 228 (only four are illustrated in FIG. 2) that move and position the optical element 226 with six degrees of freedom. Alternatively, for example, the stage assembly 227 can include less than six dual mover assemblies 228 that move and position the optical element 226 with less than six degrees of freedom.

The design of each of the dual mover assemblies 228 can be varied to suit the movement requirements of the apparatus 210. In one embodiment, each of the dual mover assemblies 228 includes a first mover 262 and a second mover 264 that move along the same movement axis 266. The movement axis 266 for only one of the dual mover assemblies 228 is illustrated. In FIG. 2, the first mover 262 is a coarse mover that makes relatively coarse, relatively large adjustments to the position of the optical element 226 along the movement axis 266 and the second mover 264 is a fine mover that makes relatively fine, relatively small adjustments to the position of the optical element 226 along the movement axis 266. In alternative, non-exclusive embodiments, the first mover 262 can move the optical element 226 approximately 2, 3, 4, 5, 6, or 10 time more than the second mover 264. Alternatively, the first mover 262 can be the fine mover and the second mover 264 can be the coarse mover and/or the amount of relative movement of each mover 262, 264 can be larger or smaller than the values detailed above.

Moreover, in FIG. 2, the second mover 264 is stacked directly on top of the first mover 262, the second mover 264 is rigidly coupled to the first mover 262, and the movers 262, 264 act in series to move along the movement axis 266. With this design, the movement of the first mover 262 results in concurrent movement of the second mover 264, and the total output of the movers 262, 264 along the movement axis 266 is the summation of the output of the first mover 262 and the output of the second mover 264.

The design of each mover 262, 264 can be varied pursuant to the teachings provided herein. In one embodiment, each mover 262, 264 is a piezoelectric element. With a piezoelectric element, an electrical potential applied across the element causes a change in the length of the element. Alternatively, in certain embodiment, each mover can be another type of position actuator.

As provided herein, with the two movers 262, 264, the positioning accuracy of the stage assembly 227 is enhanced by driving the two movers 262, 264 simultaneously. Further, the two movers 262, 264 offer superior disturbance attenuation within servo bandwidth.

In FIG. 2, the bottom of the first mover 262 is secured to the stage base 258 and the top of the second mover 264 is secured to the stage 260. In one embodiment, flexures and/or hinges are used to connect the movers 262, 264 to the stage base 258 and the stage 260.

The measurement system 222 includes one or more sensors 230 (only one is illustrated in FIG. 2 as a box) that monitors the position of the stage 260 and/or the optical element 226 and provides a measurement position that is transferred to the control system 224 relating to the position of the stage 260. In one embodiment, the sensor 230 provides a single signal that relates to the total output of the two movers 262, 264 of one of the dual mover assemblies 228. In one embodiment, only one measurement signal is available for the control of the dual actuator assemblies 228. Additionally, the measurement system 222 includes more sensors that monitor the total output of the other dual mover assemblies 228.

The control system 224 independently directs voltage to and individually controls each of the movers 262, 264 of each dual mover assembly 228 to precisely position the stage 260. Typically, the control system 224 has a maximum voltage at which it can direct voltage to each of the movers 262, 264. In one embodiment, for example, the control system 224 can direct a maximum voltage of 150 volts to each mover 262, 264 with 65535 separate counts. In this embodiment, for example, the first mover 262 can have a maximum stroke of approximately 75 μm along the movement axis 266 when 150 volts are directed to the first mover 262, and the second mover 264 can have a maximum stroke of approximately 17 μm along the movement axis 266 when 150 volts are directed to the second mover 264.

As provided herein, a quantization level Q for each mover 262, 264 is equal to the maximum voltage divided by the number of counts. For the example provided above, Q=150/65535=2.2889 mv/count. Stated in another fashion, for each mover 262, 264 each count equals 2.2889 millivolts. Thus, the control system 224 can direct voltage to each mover 262, 264 in increments of 2.2889 millivolts.

Further, for each mover 262, 264 the resolution is approximately equal to the maximum stroke divided by the maximum voltage. For the example provided above, (i) the resolution for the first mover 262 is approximately 500 nm/volt ($R_1$=75 μm/150 volts=500 nm/volt), and (ii) the resolution for the second mover 264 is approximately 113.33 nm/volt ($R_2$=17 μm/150 volts=113.33 nm/volt).

Moreover, in this embodiment, for each count (2.2889 millivolts/count), (i) the first mover 262 moves approximately 1.14 nm ((500 nm/volt)×(2.2889 mv/count)) and (ii) the second mover 264 moves approximately 0.26 nm ((113.33 nm/volt)×(2.2889 mv/count)). Stated in another fashion, with this embodiment, the first mover 262 can be moved in increments 1.14 nm and the second mover 264 can be moved in increments of 0.26 nm.

As an overview, in certain embodiments, the control system 224 effectively decouples the control of the two movers 262, 264 of each dual mover assembly 228, and utilizes a quantization error feedforward loop to reduce the quantization error to that of the fine second mover 264. This design provides superior disturbance attenuation within the servo bandwidth of the two movers 262, 264. The operation of the control system 224 can better be understood with reference to the block diagrams described below.

Figure 3A:
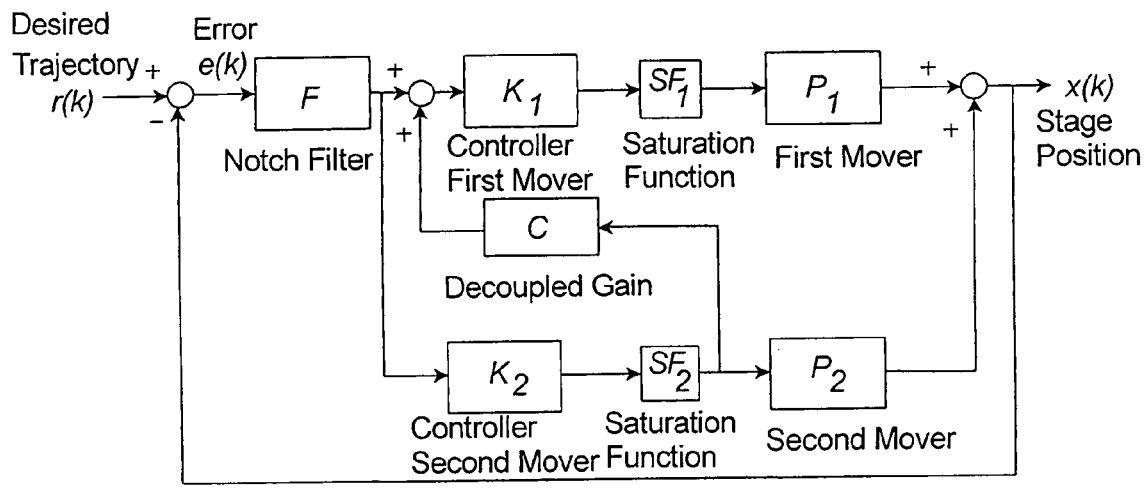
FIG. 3A illustrates a first embodiment of a control block diagram having features of the present invention.

FIG. 3A illustrates a first embodiment of a simplified control block diagram for controlling one dual mover assembly 228 (illustrated in FIG. 2) and moving a stage, such as the optical stage 260 of FIG. 2 or another type of device along a movement axis. In FIG. 3A, the block diagram illustrates how the control system can be designed to essentially decouple the control of the coarse first mover and the fine second mover and separate the performance of the coarse first mover and the fine second mover. With this design, the control of each mover can be designed independently. For example, the control design of the coarse, first mover remains the same optimal single-actuator design for best performance. Further, the fine, second mover is controlled to function as a supplementary actuator that provides the fine resolution and faster response for enhancing the servo performance.

In FIG. 3A, (i) "r" represents a reference position, e.g. the desired trajectory of the stage at a particular moment in time, (ii) "e" represents a following error, e.g. the error between the desired position and a measured output position of the stage at a particular moment in time, (iii) "F" represents a notch filter that reduces noise, (iv) "$K_1$" represents the controller for the coarse first mover, (v) "$SF_1$" represents a saturation function (e.g. a maximum amount of movement) of the first mover, (iv) "$P_1$" represents the hardware of the coarse first mover, (vi) "C" represents decoupled gain, (vii) "$K_2$" represents the controller for the fine second mover, (viii) "$SF_2$" represents a saturation function (e.g. a maximum amount of movement) of the second mover, (ix) "$P_2$" represents the hardware of the fine second mover, and (x) "x" represents the measured, actual momentary, output position of the stage as measured by the sensor at a particular moment in time. In FIG. 3A, with the use of the decoupled gain, the control of the two movers is essentially decoupled and the performance of the two movers are separate.

Figure 3B:
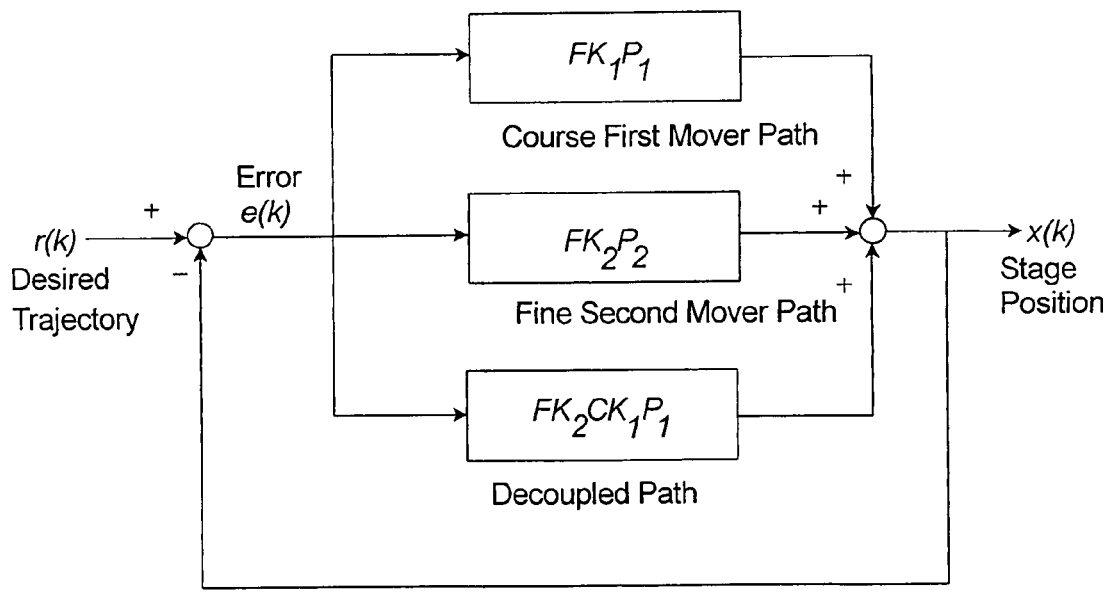
FIG. 3B is a simplified illustration of the control block diagram of FIG. 3A.

FIG. 3B is a control block diagram that is a simplified version of the control block diagram illustrated in FIG. 3A for controlling the two movers. As illustrated in FIG. 3B, there are three forward servo paths in parallel, namely a coarse first mover path, a fine second mover path, and a decoupled path. The parallel control system structure in FIG. 3 has the open-loop transfer function $G_{OL}$ as detailed in equation 1 below.

$$G_{OL}=FK_1P_1+FK_2P_2+FK_2CK_1P_1 \quad \text{Equation (1)}$$

From equation 1, the sensitivity function S for the system becomes $$S=1/(1+FK_1P_1+FK_2P_2+FK_2CK_1P_1) \quad \text{Equation (2)}$$

In one embodiment, the decoupled gain is designed to be $$C \approx P_2 F \quad \text{Equation (3)}$$

With this design, the sensitivity function S for the system becomes $$S \approx 1/(1+FK_1P_1+FK_2P_2+FK_2P_2FK_1P_1) \quad \text{Equation (4)}$$

Using algebra, Equation 4 can be simplified to be $$S \approx 1/((1+FK_1P_1)(1+FK_2P_2)) \quad \text{Equation (5)}$$

As provided herein, the sensitivity function S for the system is also equal to the sensitivity $S_1$ of the first mover loop multiplied by the sensitivity $S_2$ of the second mover loop.

$$S=S_1 \times S_2 \quad \text{Equation (6)}$$

Combining equations 5 and 6 results in $$S_1 \times S_2=1/((1+FK_1P_1)(1+FK_2P_2)) \quad \text{Equation (7)}$$

Equation 7 can be separated into the sensitivity of the first mover and the sensitivity of the second mover as detailed below:

$$S_1=1/(1+FK_1P_1) \quad \text{Equation (8)}$$

$$S_2=1/(1+FK_2P_2) \quad \text{Equation (9)}$$

It should be noted that the performance of whole system is enhanced because the sensitivity function S is equivalent to the $S_1$ multiplied by $S_2$ (the sensitivity functions of the movers). As a result thereof, the overall sensitivity is enhanced.

With the joining of the decoupled loop, both the coarse first mover servo loop and the fine second mover servo loop can be designed separately as normal single actuator designs as in equations 8 and 9. Further, the combined designs will have the sensitivity detailed in equation 6. This greatly simplifies the design of the controls for the first mover and the second mover.

Figure 3C:
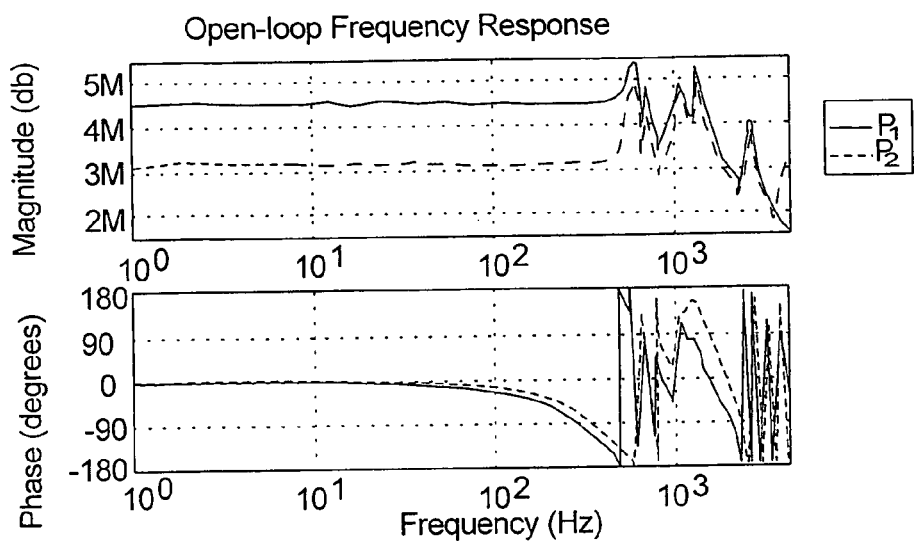
FIG. 3C illustrates the open-loop frequency response of two movers.

FIG. 3C illustrates the open-loop frequency response of the two movers and includes an upper graph that illustrates magnitude of response versus frequency and a lower graph that illustrates phase of response versus frequency. In each graph of FIG. 3C, the solid line represents the response of the coarse first mover $P_1$ and the dashed line represents the response of the fine second mover $P_2$.

As illustrated in the upper graph of FIG. 3C, at lower frequencies, $P_1$ is approximately equal to 4.6M, and $P_2$ is approximately equal to 3.2M. For FIG. 3C, in alternative, non-exclusive embodiments, the value of M can be approximately 5, 10, 15, or 20. For example, if M is equal to 5, at low frequencies, $P_1$ is approximately equal to 23 dB and $P_2$ is approximately equal to 16 dB. Alternatively, if M is equal to 10, at low frequencies, $P_1$ is approximately equal to 46 dB and $P_2$ is approximately equal to 32 dB.

As provided in equation 3 above, the decoupled gain design is approximately equal to the notched fine second mover ($C \approx P_2 F$). The decoupled gain can be approximated by a constant. In the example when M is equal to 5, $P_2$ is approximately equal to 16 dB, and $C \approx 16$ dB=6.3 (20 log X=Y dB). Alternatively, in the example when M is equal to 10, $P_2$ is approximately equal to 32 dB, and $C \approx 32$ dB=40 (20 log X=Y dB). 40.0.

Figure 3D:
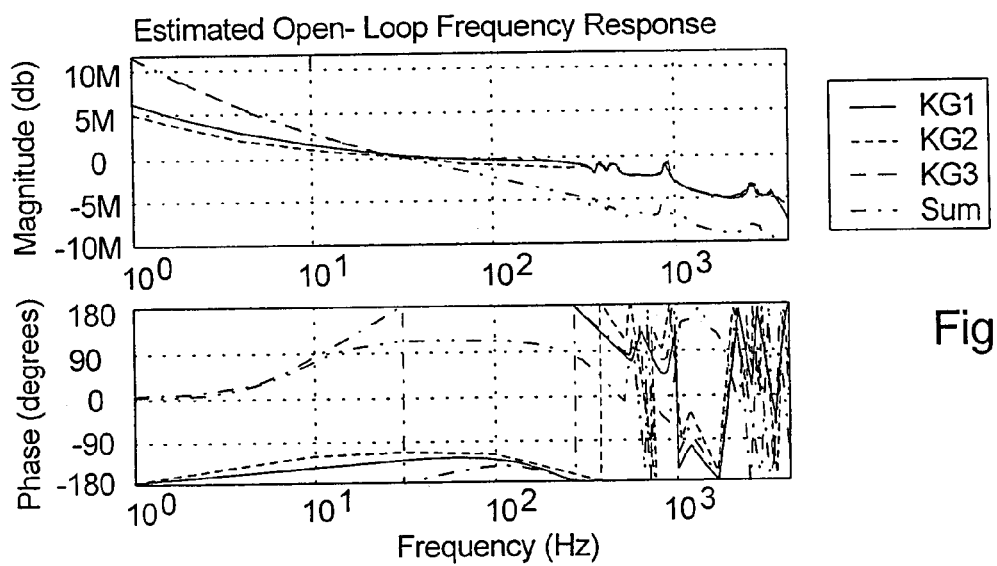
FIG. 3D illustrates the open-loop frequency response after the design of the first mover path, the second mover path, the decoupled path and Sum is the summation of three paths.

FIG. 3D illustrates the open-loop frequency response after the design of the coarse first mover path, the fine second mover path, the decoupled path and Sum is the summation of three paths. In FIG. 3D, the upper graph illustrates magnitude of response versus frequency and the lower graph illustrates phase of response versus frequency. In each graph of FIG. 3D, the solid line represents the response of the coarse first mover path $KG_1$, the short dashed line represents the response of the fine second mover path $KG_2$, the longer dashed line represents the response of the decoupled path $KG_3$, the irregular dashed line represents the summation of response Sum. For FIG. 3D, in alternative, non-exclusive embodiments, the value of M can be approximately 5, 10, 15, or 20.

Figure 3E:
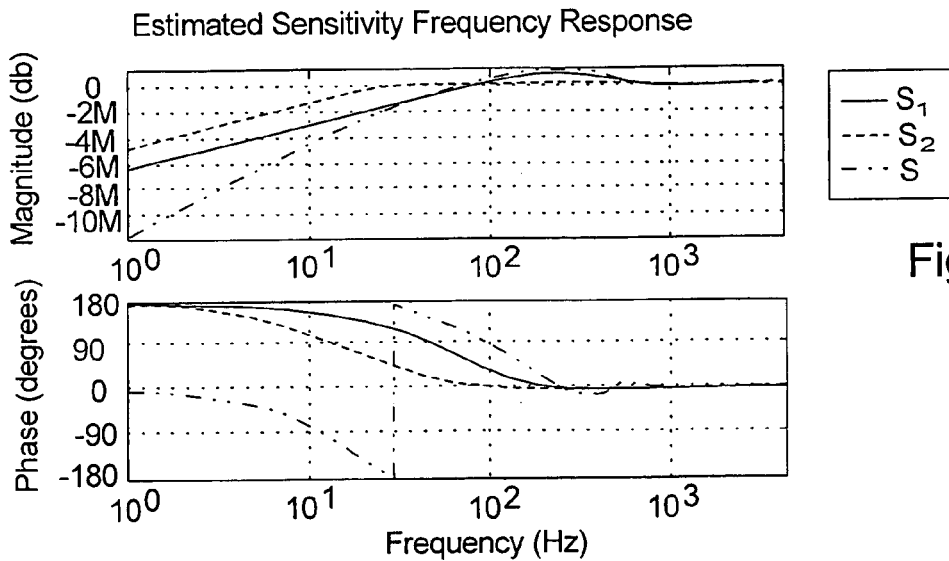
FIG. 3E illustrates the estimated sensitivity frequency response for the coarse first mover, the fine second mover path, and dual mover assembly sensitivity.

FIG. 3E illustrates the estimated sensitivity frequency response for the coarse first mover, the fine second mover path, and dual mover assembly sensitivity. In FIG. 3E, the upper graph illustrates magnitude of the sensitivity versus frequency and the lower graph illustrates phase of response versus frequency. In each graph of FIG. 3E, the solid line represents the sensitivity function $S_1$ of the coarse first mover, the short dashed line represents the sensitivity function $S_2$ of the fine second mover, and the irregular dashed line represents resulting, overall sensitivity S of the dual mover assembly. For FIG. 3E, in alternative, non-exclusive embodiments, the value of M can be approximately 5, 10, 15, or 20.

As detailed in Equation 6 above, the sensitivity of the dual mover assembly loop S is equal to the sensitivity of the first mover $S_1$ multiplied by the sensitivity of the second mover $S_2$ ($S=S_1 \times S_2$). As a result thereof, the low-frequency attenuation capability of the assembly will significantly increase due to the use of the control system and the dual mover assembly provided herein.

Figure 4A:
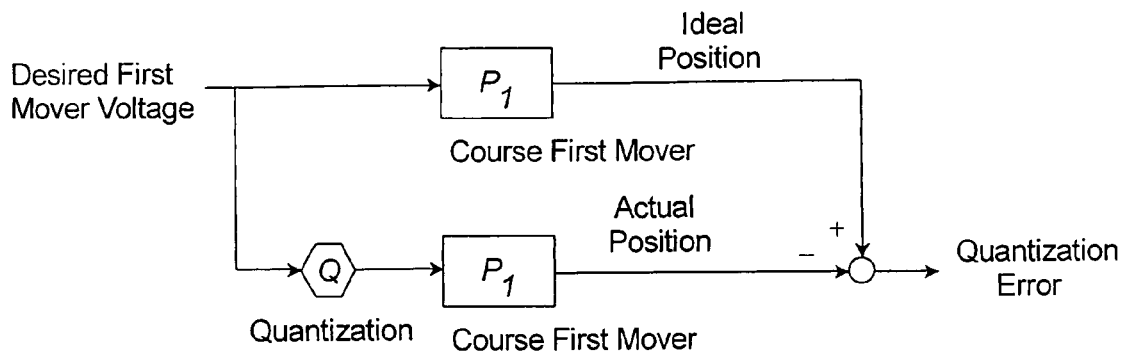
FIG. 4A is a control block diagram that illustrates quantization error for a mover.

Additionally, as mentioned above, in certain embodiments, the control system can utilize a quantization error feedforward loop to reduce the quantization error for the dual mover assembly. FIG. 4A is a control block diagram that illustrates the quantization error of the first mover. As a background, the conversion from a floating-point voltage command to digital counts of the voltage amplifier input results in a quantization error.

In FIG. 4A, the left side of the block diagram starts with the desired voltage that is to be sent to the coarse first mover. The upper part of the diagram represents the ideal position that results from the voltage being directed to the coarse first mover, and the lower part of the diagram represents the actual position that results from the quantized voltage that is actually being directed to the coarse first mover. The right side of the diagram represents the quantization error, which is the difference between the ideal position and the actual position.

In one of the examples provided above above, (i) the quantization level for each mover 262, 264 is Q=2.2889 mv/count, (ii) the control system 224 directs voltage to each mover 262, 264 in increments of 2.2889 millivolts, and (iii) the resolution for the first mover is approximately 500 nm/volt. In one non-exclusive example, if the control system determines that 12.6566 millivolts is the desired voltage that should be delivered to the first mover to position the stage, the actual voltage that is delivered to the first mover after quantization can be 11.4445 millivolts ((12.6566 millivolts/2.2889 mv/count)≈5 counts and (5 counts×2.2889 mv/count)=11.4445 millivolts)). In this example, (i) the desired voltage delivered to the first mover results in an ideal position of 6.3283 nm (500 nm/volt×0.0126566 volts=6.3283 nm), (ii) the actual voltage delivered to the first mover results in an actual position of 5.7225 nm (500 nm/volt×0.0114445 volts=5.7225 nm), and (iii) the quantization error is 0.6058 nm (6.3283 nm−5.7225 nm=0.6058 nm).

It should be noted that the quantization steady state error for a design with only the coarse first mover $\tilde{q}_{ss}$ is bounded by $$|\tilde{q}_{ss}| \leq |P_1(1)|\frac{Q}{2} \quad \text{Equation (10)}$$

where $P_1(1)$ is the DC gain of coarse first mover.

Figure 4B:
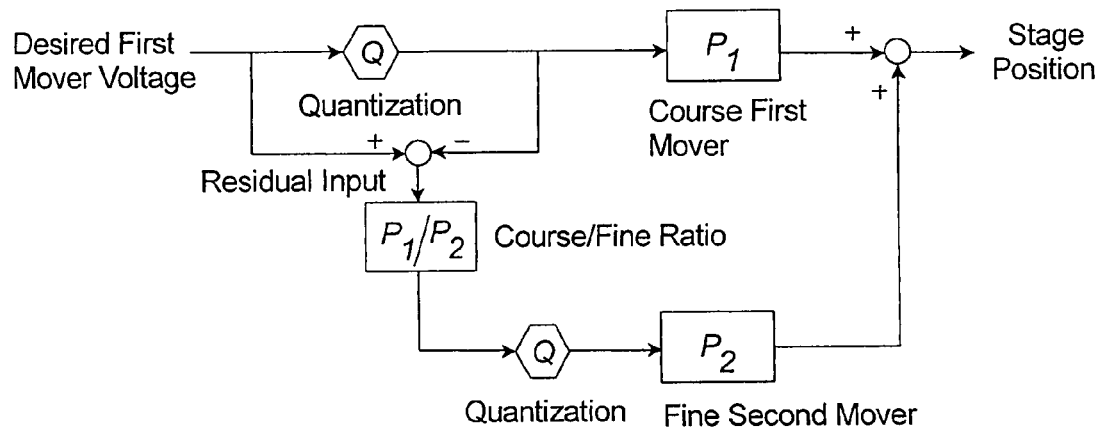
FIG. 4B is a control block diagram that includes a quantization error feedforward loop.

FIG. 4B is a simplified control block diagram that utilizes a quantization error feedforward loop for the control of the dual mover assembly to reduce the error caused by signal quantization. More specifically, in this embodiment, the quantization error from the coarse first mover is transferred to the control of the fine, second mover. Stated in another fashion, the residual input of the coarse first mover caused by quantization is transferred to the control of the fine, second mover for further reduction of such quantization error. In FIG. 4B, the coarse/fine ratio is the ratio of the DC gain of the first mover $P_1$ and the DC gain of the second mover $P_2$.

Figure 4C:
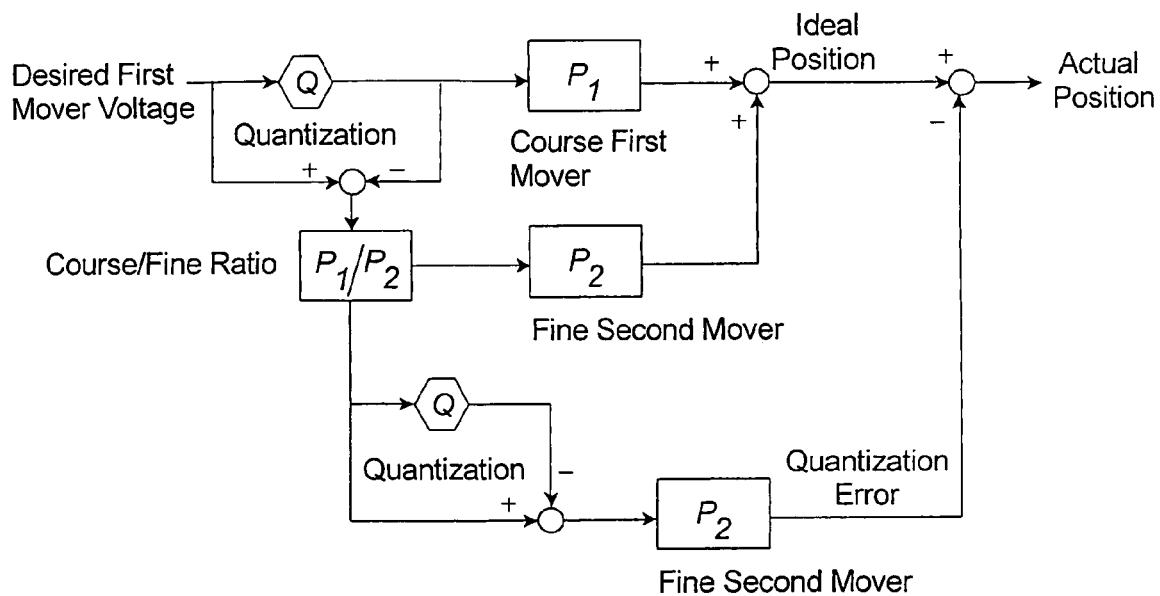
FIG. 4C a simplified illustration of the control block diagram of FIG. 4B.

FIG. 4C is an equivalent version of the control block diagram illustrated in FIG. 4B that further illustrates the proposed quantization error reduction. In this embodiment, in the event the feedforward path to fine second mover is perfect and there is no quantization at the fine second mover, the steady state error at the coarse first mover can be totally compensated by transferring the residual input to the control of the fine second mover and become zero. However, the joining of the fine second mover also creates a quantization effect. More specifically, with this design, the quantization steady state error of the above scheme $\tilde{q}_{ss}$ becomes bounded by $$|\tilde{q}_{ss}| \leq |P_2(1)|\frac{Q}{2} \quad \text{Equation (11)}$$

where $P_2(1)$ is the DC gain of fine second mover.

As a result thereof, regardless the resolution of coarse first mover, the final quantization error level of quantization error feedforward method is entirely dependent on the DC gain of the fine second mover. Stated in another fashion, in this embodiment, the quantization error is reduced to that of the fine second mover 264. With this design, the relatively small stroke of the fine second mover will reduce the quantization error significantly. Moreover, with this control scheme and with the dual actuator assembly, the dual actuator assembly should have the same resolution as the fine, second mover irregardless of the design of the coarse first mover.

Figure 5:
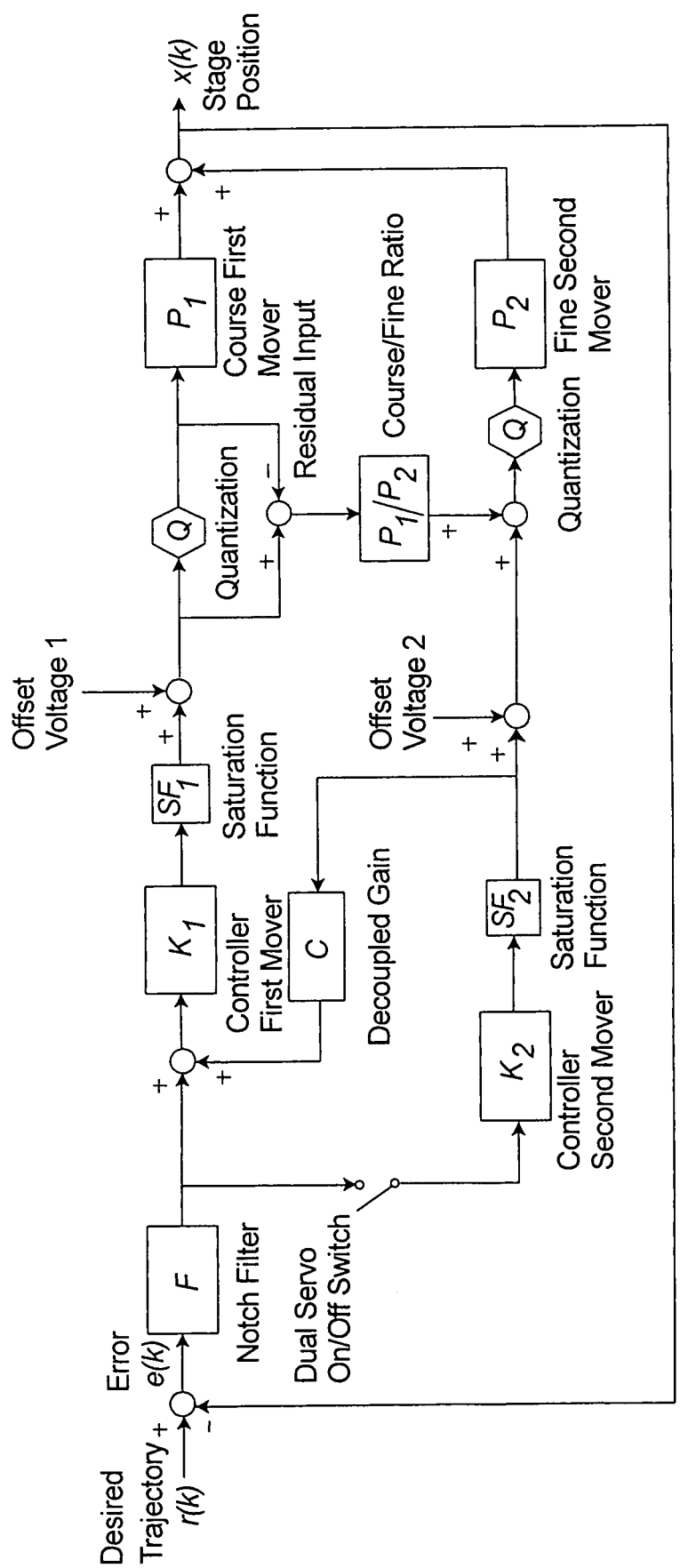
FIG. 5 illustrates a control block diagram for controlling the two movers of the dual mover assembly.

FIG. 5 control block diagram that combines the decoupling of the control of the coarse first mover and the fine second mover (described above and illustrated in FIGS. 3A and 3B) with a quantization error feedforward loop (described above and illustrated in FIGS. 4B and 4C) for the control of the dual mover assembly. With this design, the local quantization error feedforward should not influence the stability of the dual mover assembly and should increase the performance.

In FIG. 5, the input voltage to both movers is always positive. However, the controller output can be either positive or negative. By adding the offset voltage 1, this avoids the sum of the input voltage to the coarse first mover being less than zero. Similarly, by adding the offset voltage 2, this avoids the sum of the input voltage to the fine second mover being less than zero.

Figure 6:
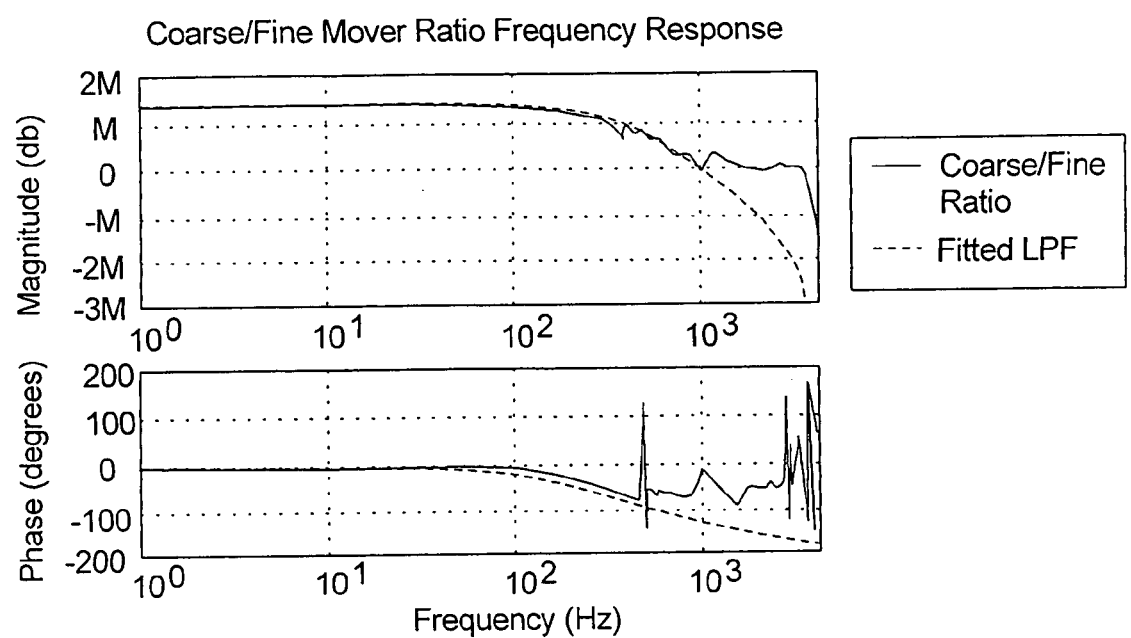
FIG. 6 illustrates the coarse/fine ratio frequency response $(P_1/P_2)$ of the two movers of the dual mover assembly.

The coarse/fine ratio can be derived from the open-loop frequency response measurements illustrated in FIG. 3C and described above. Alternatively, the frequency response of $P_1/P_2$ can be approximated by a transfer function or a digital filter. FIG. 6 illustrates the coarse/fine ratio frequency response ($P_1/P_2$) of the two movers and includes an upper graph that illustrates magnitude of response versus frequency and a lower graph that illustrates phase of response versus frequency. In each graph of FIG. 6, the solid line represents the coarse/fine ratio and the dashed line represents the fitted low pass filter "LPF".

For FIG. 6, in alternative, non-exclusive embodiments, the value of M can be approximately 5, 10, 15, or 20. Further, in FIG. 6A, the frequency response of $P_1/P_2$ is approximated by a $2^{nd}$ order low-pass filter, which has DC gain 4.9, a cutoff frequency 650 Hz, and a damping ratio 1.0.

In one example provided above, (i) the coarse first mover has a maximum movement of 75 μm at the maximum voltage of 150 volts, (ii) the fine second mover has a maximum movement of 17 μm at the maximum voltage of 150 volts, (iii) the quantization level is same for movers Q=2.2889 mv/count, (iv) the resolution of the coarse first mover is approximately $P_1(1)$=500 nm/volt, and (v) the resolution of the fine second mover is approximately $P_2(1)$=113.33 nm/volt. With this example, the quantization steady state error for the coarse first mover is as follows:

$$|\tilde{q}_{ss}| \le |P_1(1)|\frac{Q}{2} = 0.57221 \text{ nm}$$

However, with the quantization error feedforward control design, the quantization steady state error is equal to the quantization error of the fine second mover and is as follows:

$$|\tilde{q}_{ss}| \le |P_2(1)|\frac{Q}{2} = 0.1297 \text{ nm}$$

Accordingly, with the present invention, the error in positioning caused by quantization is significantly reduced.

Figure 7A:
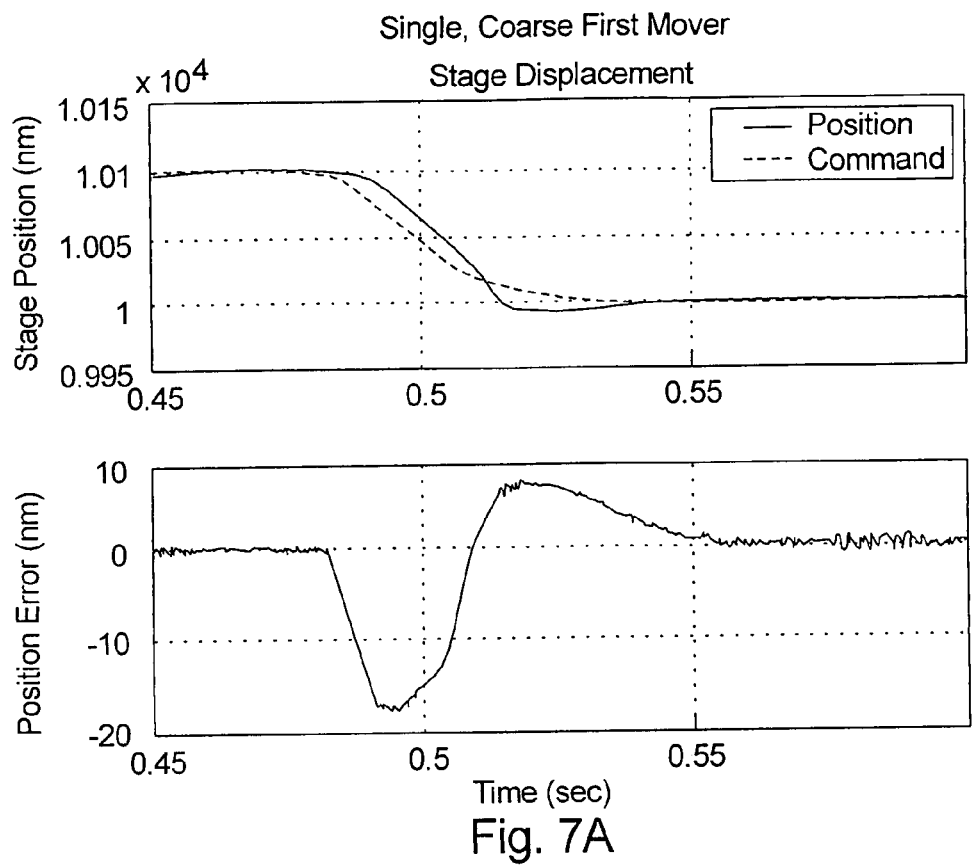
FIGS. 7A-7D illustrate the performance of a single coarse mover when a 100 nm step-down is directed to the single coarse mover.
Figure 7B:
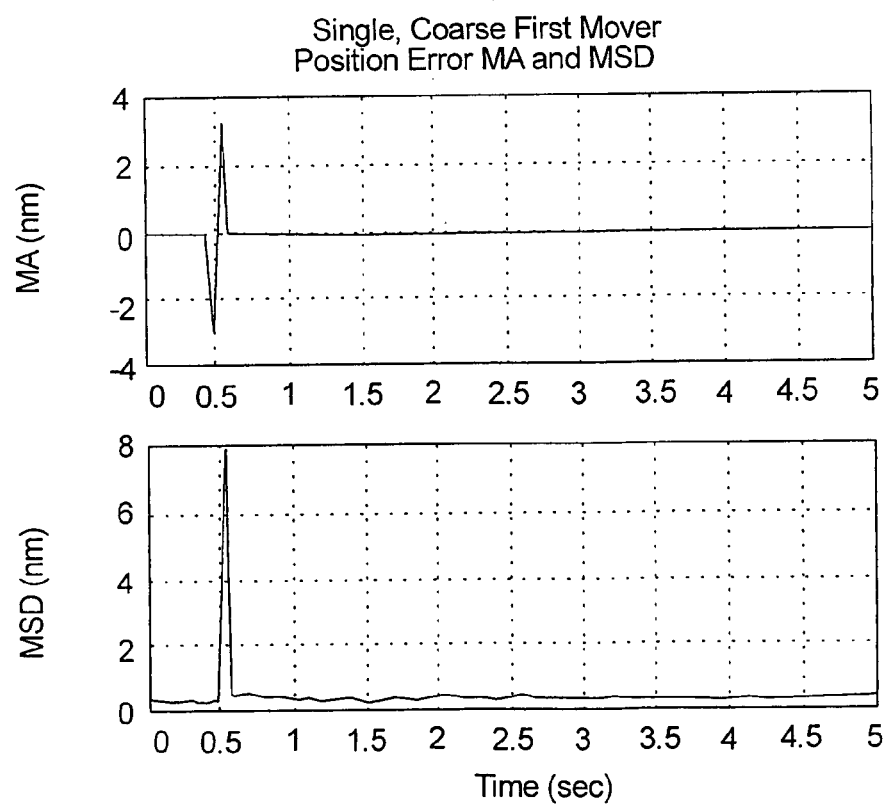
Figure 7C:
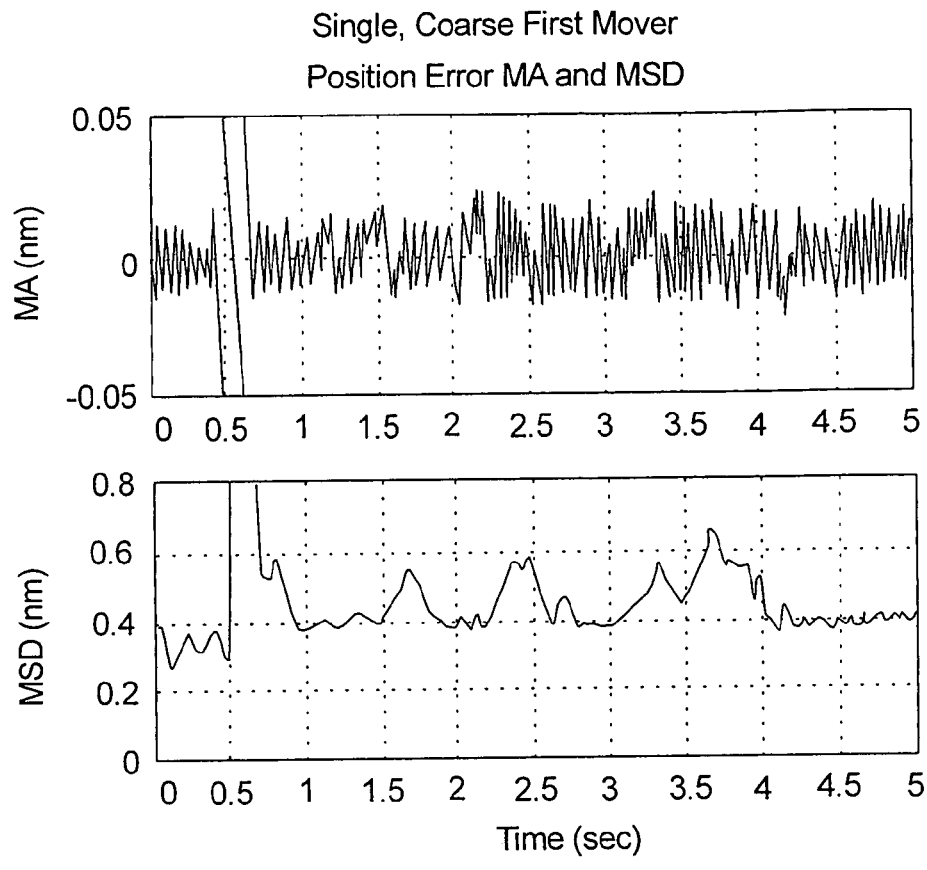
Figure 7D:
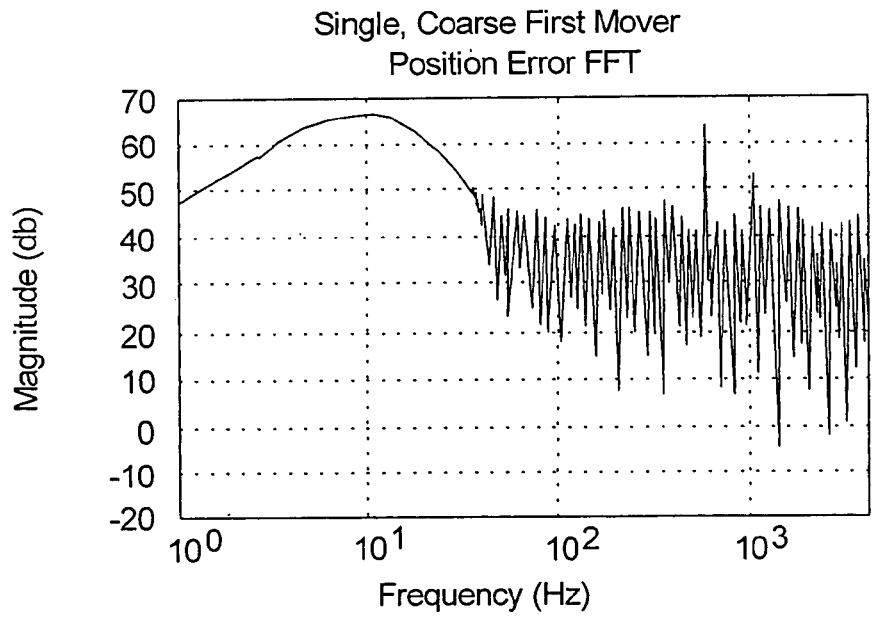

FIGS. 7A-7D illustrate the performance of a single coarse mover when a 100 nm step-down is directed to the single coarse mover. FIG. 7A includes an upper graph that illustrates stage position versus time and a lower graph that illustrates position error versus time for the 100 nm step. FIG. 7B includes an upper graph that illustrates a moving average position error versus time and a lower graph that illustrates mean standard deviation position error versus time for the 100 nm step. FIG. 7C includes graphs that are similar to the graphs in FIG. 7B, however, the data in the graphs in FIG. 7C is more focused. FIG. 7D is a graph that illustrates position error fast Fourier transform versus frequency.

Figure 7E:
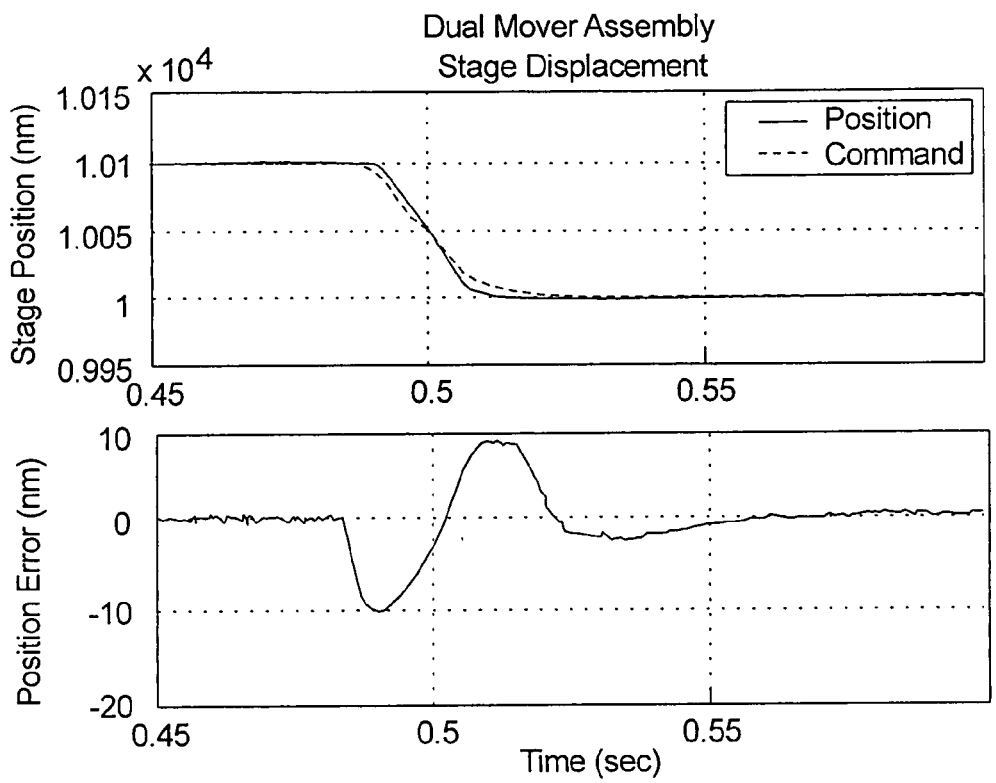
FIGS. 7E-7H illustrate the performance of a dual mover assembly when a 100 nm step-down is directed to the dual mover assembly.
Figure 7F:
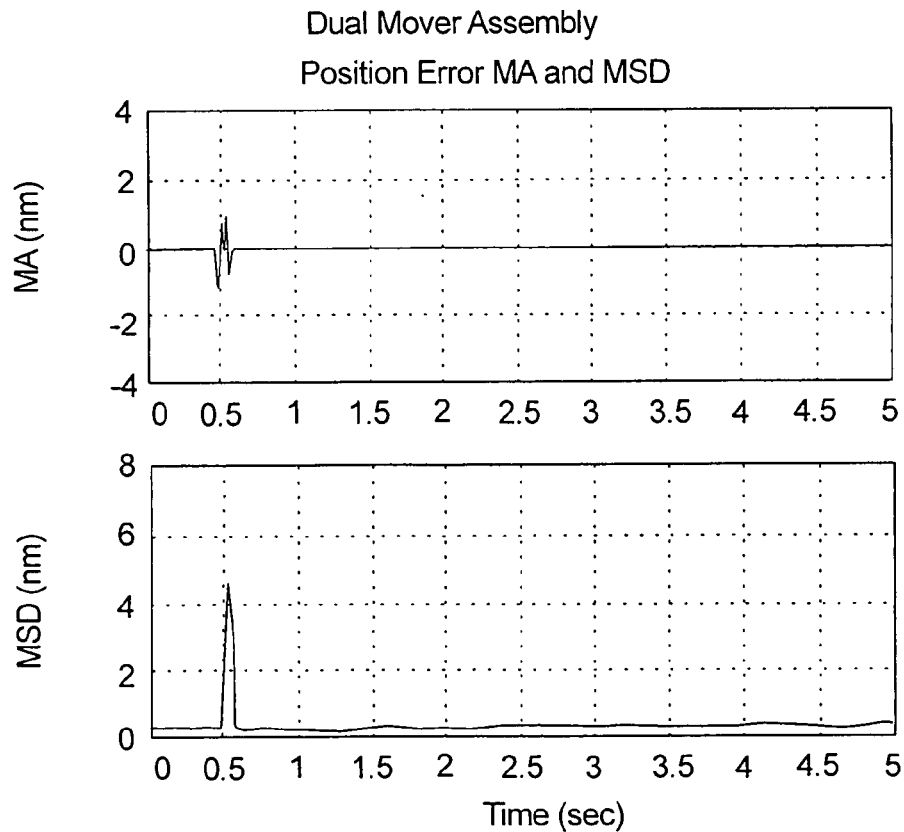
Figure 7G:
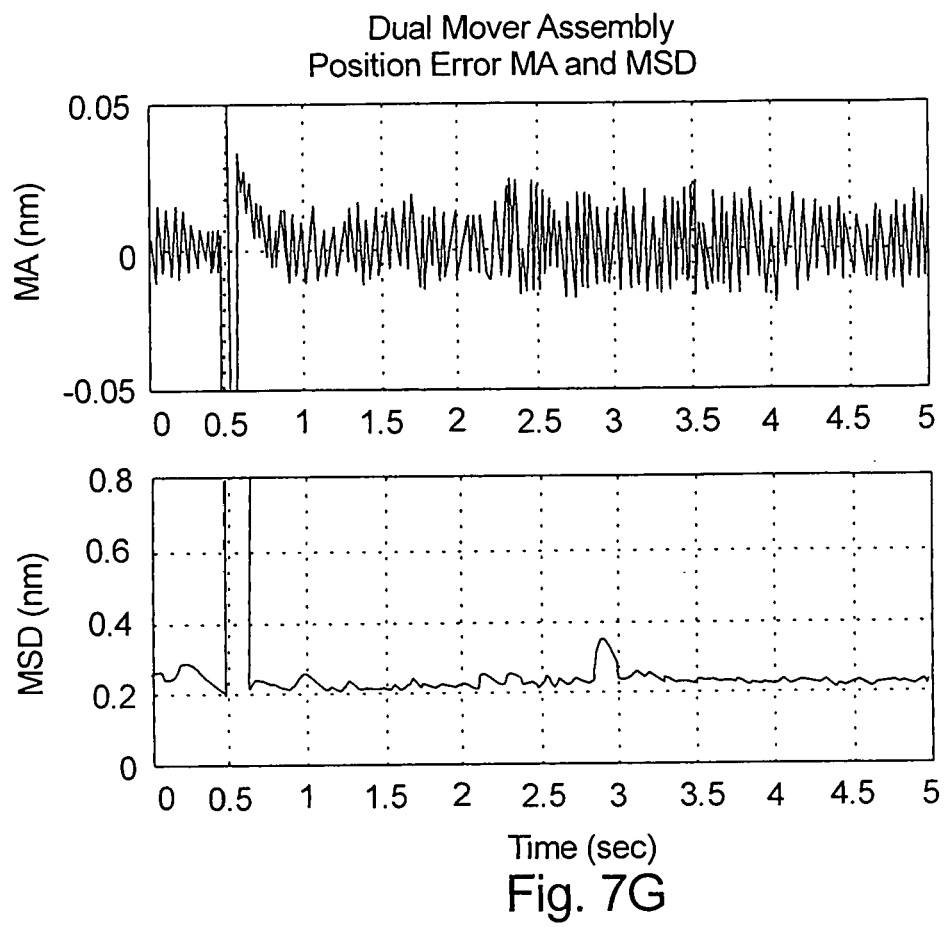
Figure 7H:
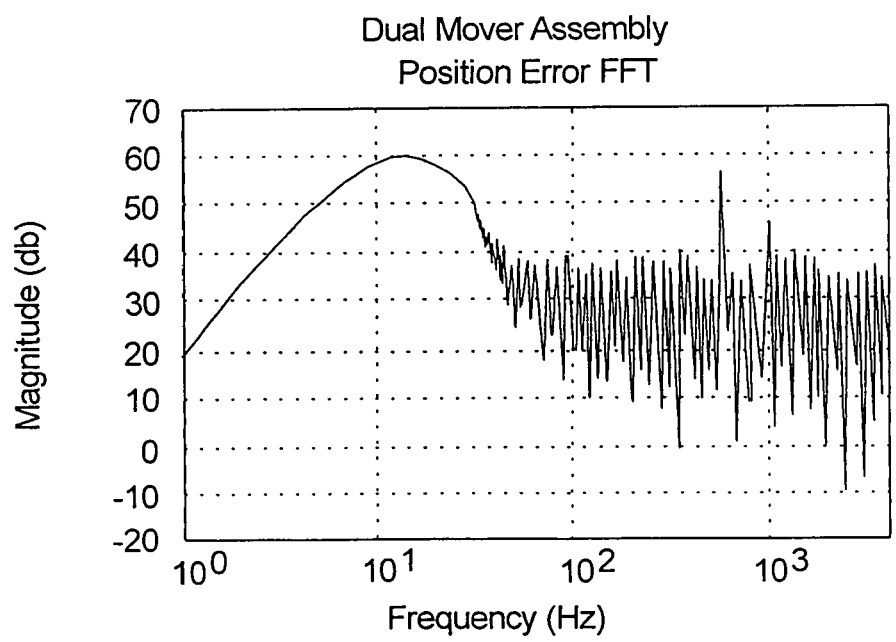

As a comparison, FIGS. 7E-7H illustrate the performance of a dual mover assembly when a 100 nm step-down is directed to the dual mover assembly. FIG. 7E includes an upper graph that illustrates stage position versus time and a lower graph that illustrates position error versus time for the 100 nm step. FIG. 7F includes an upper graph that illustrates a moving average position error versus time and a lower graph that illustrates mean standard deviation position error versus time for the 100 nm step. FIG. 7G includes graphs that are similar to the graphs in FIG. 7F, however, the data in the graphs in FIG. 7G is more focused. FIG. 7H is a graph that illustrates position error fast Fourier transform versus frequency.

When comparing FIGS. 7A-7D and FIGS. 7E-7H, it should be noted that the dual mover assembly has lower error peak, a lower moving average, and a lower mean standard deviation. Further, the mean standard deviation of the dual mover assembly is less noisy. Moreover, the dual mover assembly controlled pursuant to the teachings herein offers superior disturbance attenuation within 50 Hz servo bandwidth. Further, the quantification error feedback reduces quantization error beyond the servo bandwidth, especially the 200 Hz peak that exists for the single coarse first mover.

Figure 8A:
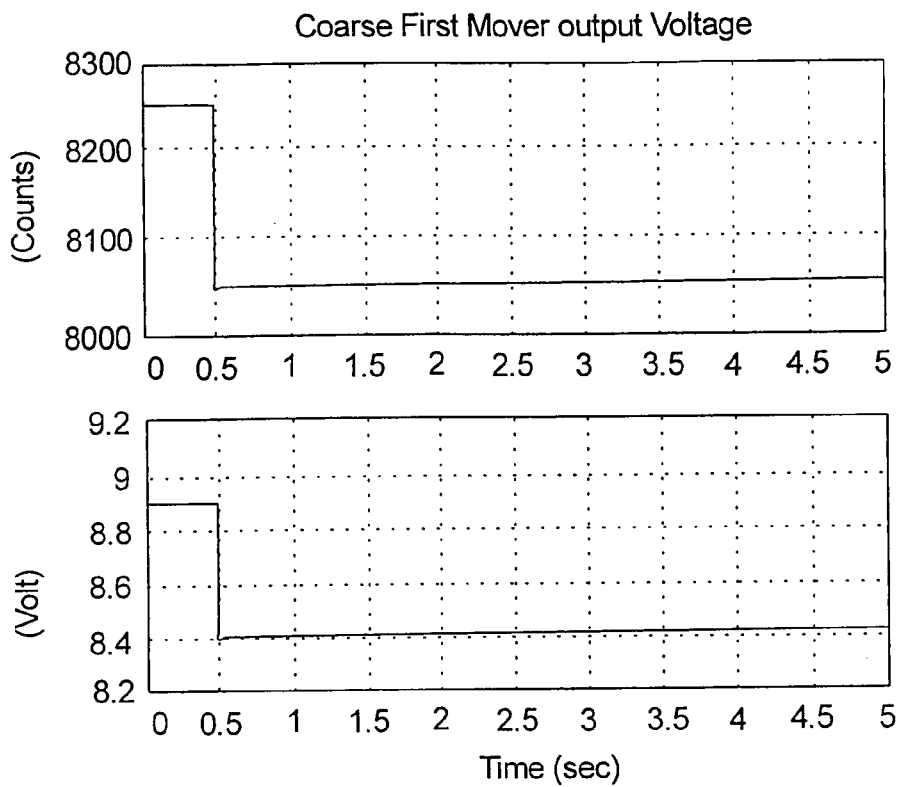
FIGS. 8A and 8B illustrate the voltage directed to the single coarse mover when a 100 nm step-down is directed to the single coarse mover.
Figure 8B:
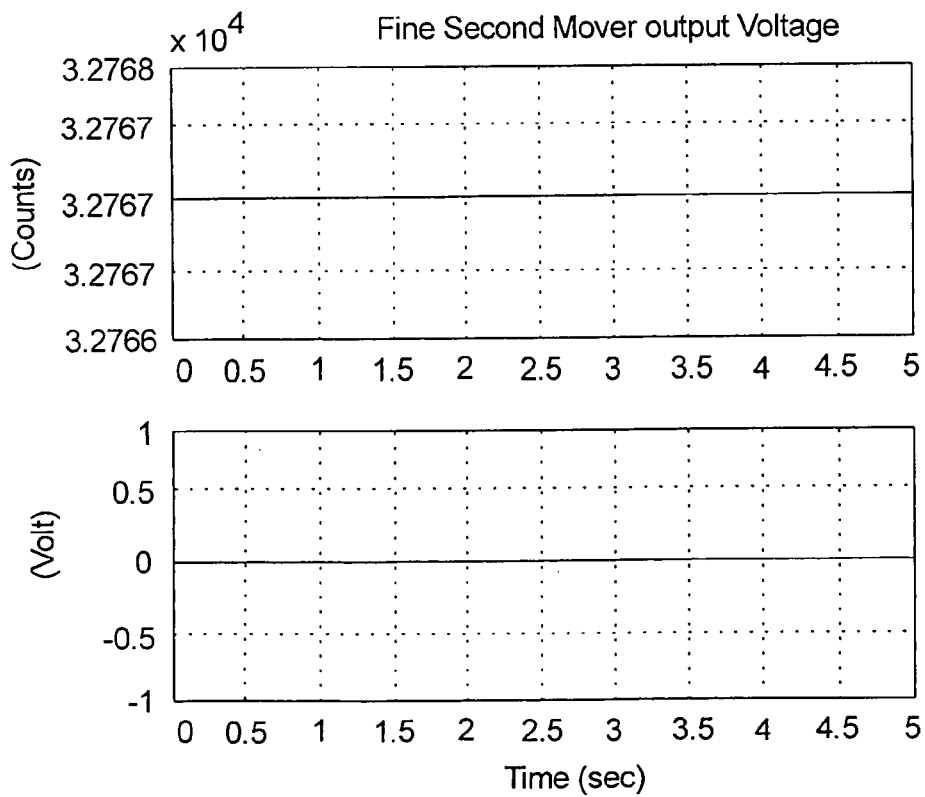

FIGS. 8A and 8B illustrate the voltage directed to the single coarse mover when a 100 nm step-down is directed to the single coarse mover. More specifically, FIG. 8A illustrates counts and voltage versus time that is directed to the coarse mover and FIG. 8B illustrates counts and voltage versus time that is directed to the fine mover. Because in this example, there is no fine second mover, there is no voltage directed to the fine second mover.

Figure 8C:
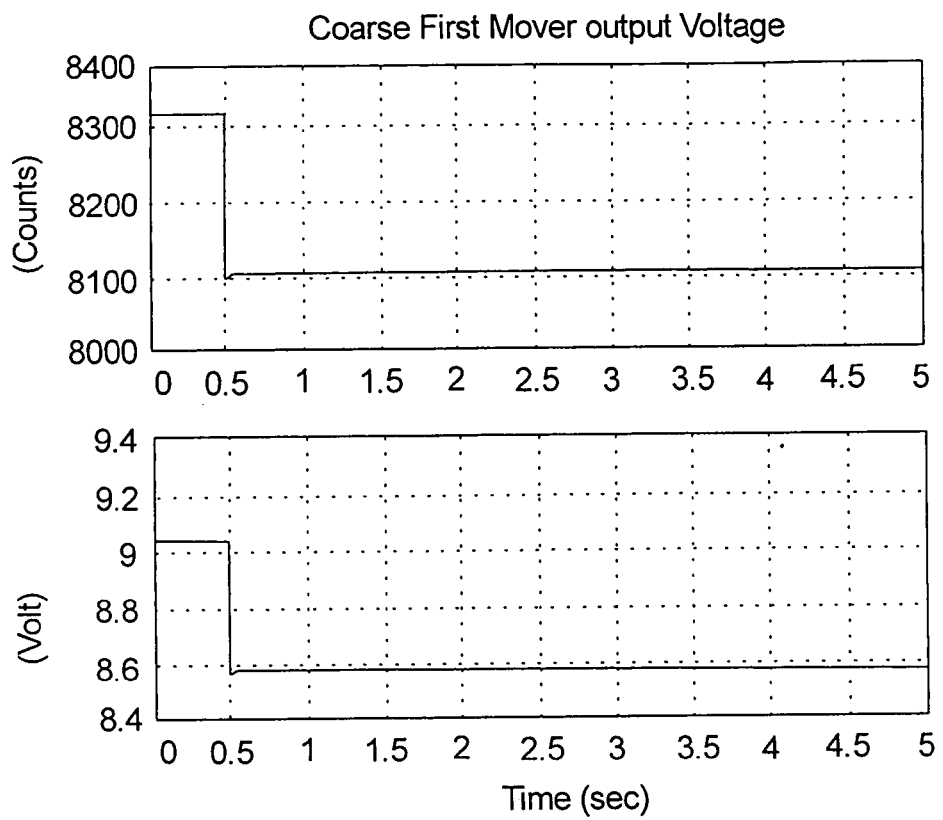
FIGS. 8C and 8D illustrate the voltage directed to the dual mover assembly when a 100 nm step-down is directed to the dual mover assembly.
Figure 8D:
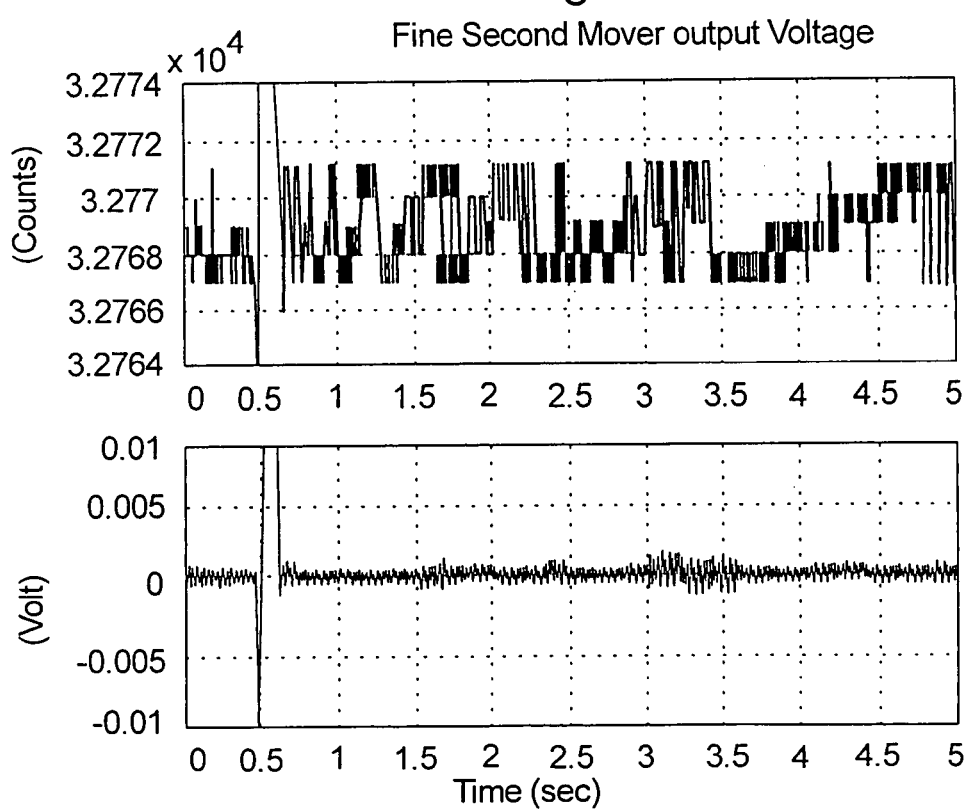

As a comparison, FIGS. 8C and 8D illustrate the voltage directed to the dual mover assembly when a 100 nm step-down is directed to the single coarse mover. More specifically, FIG. 8C illustrates counts and voltage versus time that is directed to the coarse mover and FIG. 8D illustrates counts and voltage versus time that is directed to the fine mover. With this design, the coarse, first mover is fully responsible for trajectory movement and the fine, second mover is responsible for performance enhancement but not for trajectory movement.

Figure 9A:
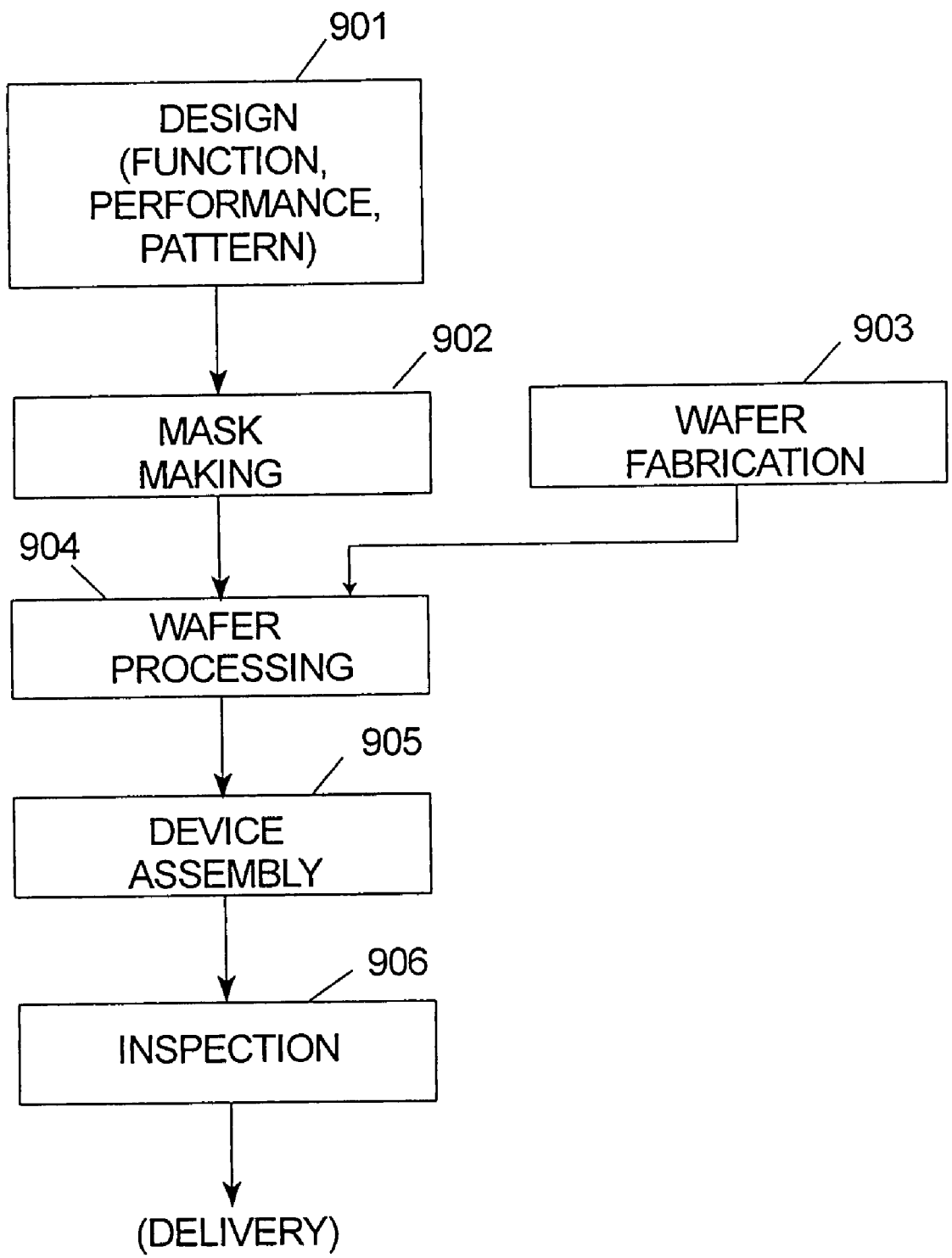
FIG. 9A is a flow chart that outlines a process for manufacturing a device in accordance with the present invention.

Semiconductor devices can be fabricated using the above described systems, by the process shown generally in FIG. 9A. In step 901 the device's function and performance characteristics are designed. Next, in step 902, a mask (reticle) having a pattern is designed according to the previous designing step, and in a parallel step 903 a wafer is made from a silicon material. The mask pattern designed in step 902 is exposed onto the wafer from step 903 in step 904 by a photolithography system described hereinabove in accordance with the present invention. In step 905, the semiconductor device is assembled (including the dicing process, bonding process and packaging process), finally, the device is then inspected in step 906.

Figure 9B:
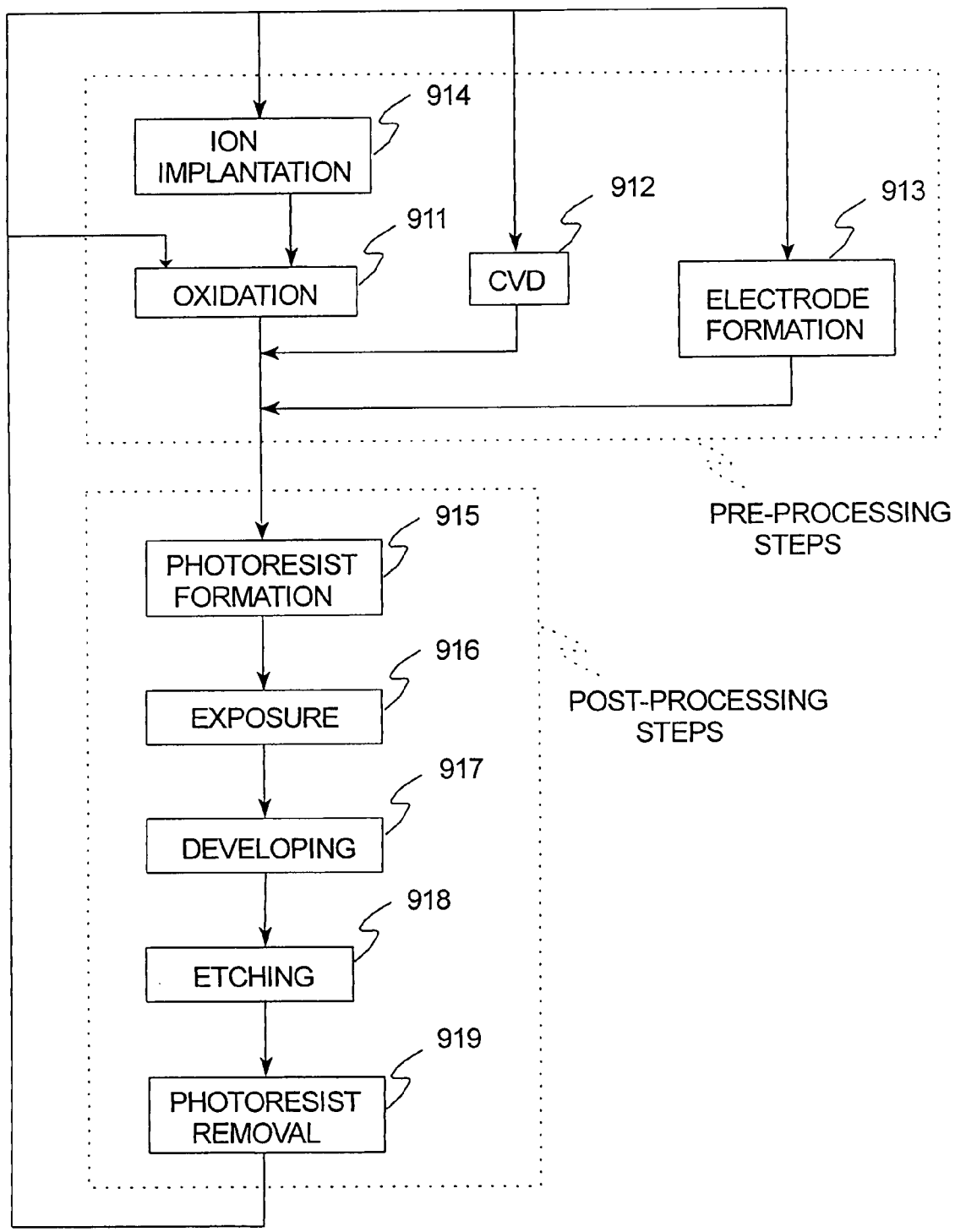
FIG. 9B is a flow chart that outlines device processing in more detail.

FIG. 9B illustrates a detailed flowchart example of the above-mentioned step 904 in the case of fabricating semiconductor devices. In FIG. 9B, in step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911-914 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 915 (photoresist formation step), photoresist is applied to a wafer. Next, in step 916 (exposure step), the above-mentioned exposure device is used to transfer the circuit pattern of a mask (reticle) to a wafer. Then in step 917 (developing step), the exposed wafer is developed, and in step 918 (etching step), parts other than residual photoresist (exposed material surface) are removed by etching. In step 919 (photoresist removal step), unnecessary photoresist remaining after etching is removed. Multiple circuit patterns are formed by repetition of these preprocessing and post-processing steps.

While the current invention is disclosed in detail herein, it is to be understood that it is merely illustrative of the presently preferred embodiments of the invention and that no limitations are intended to the details of construction or design herein shown other than as described in the appended claims.

What is claimed is:

1. A precision assembly for moving a device along a movement axis, the precision assembly comprising:
   a stage that retains the device;
   a mover assembly coupled to the stage, the mover assembly including a first mover that moves the stage along the movement axis and a second mover that moves the device along the movement axis, the second mover being rigidly coupled to the first mover so that movement of the first mover results in movement of the second mover;
   a measurement system that measures a measured position along the movement axis; and
   a control system that controls the mover assembly utilizing the measured position, the control system utilizing a first mover path to control the first mover, a second mover path to control the second mover, and a decoupled path that effectively decouples the control of the first mover from the control of the second mover by directing a decoupled gain derived at least in part from the properties of the second mover to the first mover path.

2. The precision assembly of claim 1 wherein the second mover is stacked on top of the first mover and the output of the mover assembly along the movement axis is equal to the sum of the movement of the first mover and the movement of the second mover.

3. The precision assembly of claim 1 wherein each mover includes a piezoelectric element.

4. The precision assembly of claim 1 wherein one of the movers is a coarse mover and the other mover is a fine mover.

5. The precision assembly of claim 1 wherein the decoupled gain C is set to be approximately equal to a filter F used in the control system multiplied by the hardware of second mover $P_2$, so that the decoupled gain is $C \approx P_2 F$.

6. The precision assembly of claim 1 wherein a servo loop for the first mover is designed as a single actuator design and a servo loop for the second mover is designed as a single actuator design.

7. The precision assembly of claim 1 wherein a sensitivity function of the mover assembly is approximately equal to a sensitivity of the first mover multiplied by a sensitivity of the second mover.

8. The precision assembly of claim 1 wherein the control system includes a quantization error feedforward loop.

9. The precision assembly of claim 8 wherein a quantization error of the mover assembly is equal to a quantization error of the second mover.

10. The precision assembly of claim 8 wherein the quantization error feedforward loop includes transferring the quantization error from the first mover to the second mover.

11. An optical assembly comprising an optical housing, an optical element, and the precision assembly of claim 1 for positioning the optical element relative to the optical housing.

12. An exposure apparatus for transferring an image to a substrate, the exposure apparatus comprising an illumination system and the precision assembly of claim 1, for positioning the device.

13. A method for manufacturing a wafer, the method comprising the steps of providing a substrate and transferring an image to the substrate with the exposure apparatus of claim 12.

14. A precision assembly for moving a device along a movement axis, the precision assembly comprising:
   a stage that retains the device;
   a mover assembly coupled to the stage, the mover assembly including a first mover that moves the stage along the movement axis and a second mover that moves the device along the movement axis, the second mover being rigidly coupled to the first mover so that movement of the first mover results in movement of the second mover;
   a measurement system that measures a measured position along the movement axis; and
   a control system that controls the mover assembly utilizing the measured position, wherein the control of the first mover results in a first mover quantization error and the control of the second mover results in a second mover quantization error, and wherein the control system utilizes a quantization error feedforward loop that includes utilizing the first mover quantization error in the control of the second mover.

15. The precision assembly of claim 14 wherein a mover quantization error of the mover assembly is equal to the second mover quantization error.

16. The precision assembly of claim 14 wherein the second mover is stacked directly on top of the first mover and the output of the mover assembly along the movement axis is equal to the sum of the movement of the first mover and the movement of the second mover.

17. The precision assembly of claim 14 wherein each mover includes a piezoelectric element.

18. The precision assembly of claim 14 wherein one of the movers is a coarse mover and the other mover is a fine mover.

19. The precision assembly of claim 14 wherein the control system utilizes a first mover path, a second mover path and a decoupled path.

20. The precision assembly of claim 19 wherein a servo loop for the first mover is designed as a single actuator design and a servo loop for the second mover is designed as a single actuator design.

21. The precision assembly of claim 14 wherein a sensitivity function of the mover assembly is approximately equal to a sensitivity of the first mover multiplied by a sensitivity of the second mover.

22. An optical assembly comprising an optical housing, an optical element, and the precision assembly of claim 14 for positioning the optical element relative to the optical housing.

23. An exposure apparatus for transferring an image to a substrate, the exposure apparatus comprising an illumination system and the precision assembly of claim 14, for positioning the device.

24. A method for manufacturing a wafer, the method comprising the steps of providing a substrate and transferring an image to the substrate with the exposure apparatus of claim 23.

25. The precision assembly of claim 1 wherein the control system has an open-loop transfer function $G_{OL}$ that is expressed as follows:

$$G_{OL} = F\,K_1 P_1 + F\,K_2 P_2 + F\,K_2 C K_1 P_1$$

wherein (i) "F" represents a filter in the control system that reduces noise, (ii) "$K_1$" represents a controller in the control system for the first mover, (iii) "$P_1$" represents the hardware of the first mover, (iv) "C" represents decoupled gain, (v) "$K_2$" represents a controller in the control system for the second mover, and (vi) "$P_2$" represents the hardware of the second mover.

26. The precision assembly of claim 25 wherein the decoupled gain C is set to be approximately equal to the filter F used in the control system multiplied by the hardware of second mover $P_2$, so that the decoupled gain is expressed as $C \approx P_2 F$.

27. A precision assembly for moving a device along a movement axis, the precision assembly comprising:
- a stage that retains the device;
- a mover assembly coupled to the stage, the mover assembly including a coarse first mover that moves the stage along the movement axis and a fine second mover that moves the device along the movement axis, wherein the second mover is stacked on top of the first mover and the output of the mover assembly along the movement axis is equal to the sum of the movement of the first mover and the movement of the second mover;
- a measurement system that measures a measured position along the movement axis, wherein only measurement signal is provided for the control of the first mover and the second mover; and
- a control system that controls the mover assembly utilizing the measured position, the control system utilizing a first mover path to control the first mover, a second mover path to control the second mover, and a decoupled path that effectively decouples the control of the first mover from the control of the second mover by directing a decoupled gain derived at least in part from the properties of the second mover to the first mover path, the control system having an open-loop transfer function $G_{OL}$ that is expressed as follows:

$$G_{OL} = F K_1 P_1 + F K_2 P_2 + F K_2 C K_1 P_1$$

wherein (i) "F" represents a filter in the control system that reduces noise, (ii) "$K_1$" represents a controller in the control system for the first mover, (iii) "$P_1$" represents the hardware of the first mover, (iv) "C" represents decoupled gain, (v) "$K_2$" represents a controller in the control system for the second mover, and (vi) "$P_2$" represents the hardware of the second mover.

28. The precision assembly of claim 27 wherein the decoupled gain C is set to be approximately equal to the filter F used in the control system multiplied by the hardware of second mover $P_2$, so that the decoupled gain is expressed as $C \approx P_2 F$.

29. The precision assembly of claim 27 wherein the second mover is rigidly coupled to the first mover so that movement of the first mover results in movement of the second mover, and wherein the first mover and the second mover move along the same movement axis.

* * * * *

UNITED STATES PATENT AND TRADEMARK OFFICE
CERTIFICATE OF CORRECTION

PATENT NO.       : 7,583,361 B2
APPLICATION NO.  : 11/369493
DATED            : September 1, 2009
INVENTOR(S)      : Hsin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 320 days.

Signed and Sealed this

Fourteenth Day of September, 2010

David J. Kappos
*Director of the United States Patent and Trademark Office*